United States Patent [19]

Kimura et al.

[11] Patent Number: 5,679,603
[45] Date of Patent: Oct. 21, 1997

[54] METHOD OF MAKING SEMICONDUCTOR DEVICE INCLUDING HIGH RESISTIVITY LAYER

[75] Inventors: Tatsuya Kimura; Takao Ishida; Takuji Sonoda, all of Itami, Japan

[73] Assignee: Mitsubishi Denki Kabushiki Kaisha, Tokyo, Japan

[21] Appl. No.: 386,804

[22] Filed: Feb. 6, 1995

[30] Foreign Application Priority Data

Feb. 7, 1994 [JP] Japan .................. 6-013047

[51] Int. Cl.$^6$ .................. H01L 21/20
[52] U.S. Cl. .................. 437/133; 437/107; 437/129; 437/132
[58] Field of Search .................. 437/107, 129, 437/132, 133

[56] References Cited

U.S. PATENT DOCUMENTS

| | | | |
|---|---|---|---|
| 5,153,692 | 10/1992 | Morizuka | 357/34 |
| 5,426,068 | 6/1995 | Imaizumi et al. | 437/133 |

FOREIGN PATENT DOCUMENTS

| | | |
|---|---|---|
| 0403293 | 12/1990 | European Pat. Off. . |
| 0439195 | 7/1991 | European Pat. Off. . |
| 63-278282 | 11/1988 | Japan . |
| 1241817 | 9/1989 | Japan . |
| 472720 | 3/1992 | Japan . |

OTHER PUBLICATIONS

Ishikawa et al., "Highly Resistive Iron–Doped AlInAs Layers Grown By Metalorganic Chemical Vapor Deposition", Japanese Journal of Applied Physics, vol. 31, 1992, pp. L376–L378.

Institute of Physics Conference Series, "Proceedings of the Twentieth Int. Conf. Symp. on Gallium Arsenide and Related Compounds", Freiburg, Germany, vol. 136, 29 Aug. 1993 –2 Sep. 1993, Bristol and Philadelphia, pp. 655–660, XP000578008. N. Pan et al.

Japanese Journal of Applied Physics, vol. 32, No. 7A, 1 Jul. 1993, Tokyo, Japan, pp. L925–L927, XP000195578, Naritsuka et al.

Journal of Applied Physics, vol. 73, No. 8, 15 Apr. 1993, New York, pp. 4004–4008, XP000195577, Kamada et al.

Journal of Crystal Growth, vol. 131, 1993, Amsterdam, NL, pp. 186–192, XP000422000, S. Naritsuka.

S. M. SZE: "Physics of semiconductor devices", 1981, John Wiley & Sons, New York, Chichester Brisbane, Toronto, Singapore, Second Edition, XP000195579, p. 20 –p. 27.

Naritsuka et al., "Electrical Properties And Deep Levels Of InAsAs Layers Grown By Metalorganic Chemical Vapor Deposition", Journal of Crystal Growth, vol. 131, 1993, pp. 186–192.

*Primary Examiner*—Charles L. Bowers, Jr.
*Assistant Examiner*—Ramamohan Rao Paladugu
*Attorney, Agent, or Firm*—Leydig, Voit & Mayer, Ltd.

[57] ABSTRACT

A high resistance compound semiconductor layer included in a semiconductor device including a plurality of compound semiconductor layers having different compositions includes a compound semiconductor that is vapor phase grown employing an organic metal compound including In, an organic metal compound including Al, and a hydrogenated compound or an organic metal compound including As. The high resistance compound semiconductor layer includes p type impurities having a concentration that positions the Fermi level of the compound semiconductor approximately at the center of the band gap of the compound semiconductor. Therefore, it is possible to produce a high resistance AlInAs layer that has less impurities that are diffused into an adjacent compound semiconductor layer.

19 Claims, 10 Drawing Sheets

——————— Ec
═══════════ Esd (Nsd)

——————— Edd (Ndd)

——————— Ea (Na)
═══════════ Ev

△ Si : donor
● C : acceptor
□ O : deep donor depth from surface (μm)

METHOD OF MAKING SEMICONDUCTOR DEVICE INCLUDING HIGH RESISTIVITY LAYER

FIELD OF THE INVENTION

The present invention relates to a high resistance compound semiconductor layer, and a crystal growth method therefor. More particularly, this invention relates to a high resistance compound semiconductor layer formed by metal organic chemical vapor deposition, and a crystal growth method therefor.

BACKGROUND OF THE INVENTION

Recently, as a material for a compound semiconductor layer employed in an optical device and an electronic device comprising InP or InP series material, a ternary compound, AlInAs, has attracted attention. As a typical method for crystalline growing a compound semiconductor layer comprising such as AlInAs, there are molecular beam epitaxy (hereinafter referred to as MBE) and metal organic chemical vapor deposition (hereinafter referred to as MOCVD). For example, Journal of Crystal Growth 131(1993) P.186–192, "Electrical properties and deep levels of InGaAs layers grown by metalorganic chemical vapor deposition", by S. Naritsuka, T. Tada, A. Wagai, S. Fujita and Y. Ashizawa, discloses that when a crystal growth of undoped AlInAs layer is performed employing MBE, the undoped AlInAs layer increases its resistance while when a crystal growth of undoped AlInAs layer is performed employing MOCVD, the undoped AlInAs layer presents n type conductivity.

FIG. 14 is a diagram illustrating an energy band of an undoped AlInAs layer that is grown by MOCVD at a growth temperature of 620°–700 °C. In the figure, reference characters Ec, Ev, $E_{SD}$, $E_A$, and $E_{DD}$ designate energy levels of the conduction band, the valence band, the shallow donor, the shallow acceptor, and the deep donor, respectively.

Although the donor levels $E_{SD}$, $E_{DD}$ and the acceptor level $E_A$ as shown in FIG. 14 do not appear when the undoped AlInAs layer is an intrinsic semiconductor, the intrinsic semiconductor is an ideal semiconductor which is extremely difficult to fabricate. When an undoped AlInAs layer is formed by a conventional method employing MOCVD, the donor levels $E_{SD}$, $E_{DD}$, and the acceptor level $E_A$ are produced by impurities which accidentally enter.

The energy gap Ec-Ev between the conduction band and the valence band in the undoped AlInAs layer is 1.45 eV at room temperature, and the respective donor levels $E_{SD}$, $E_{DD}$, and the acceptor level $E_A$ are as in the following.

First of all, the shallow donor level $E_{SD}$ is formed by an impurity such as Si and Se, and the difference between the shallow donor level $E_{SD}$ and the conduction band level Ec is approximately Ec-$E_{SD}$=5 meV.

In addition, the shallow acceptor level $E_A$ is produced by impurity such as Zn, and the difference between the shallow acceptor level $E_A$ and the valence band level $E_v$ is approximately $E_v$-$E_A$=20 meV.

In addition, the deep donor level $E_{DD}$ is produced by oxygen, and the difference between the deep donor level $E_{DD}$ and the conduction band level Ec takes a lot, e.g., values of 0.3, 0.45, and 0.5 eV.

When the undoped AlInAs layer is formed by MOCVD at a growth temperature of 620°–700 °C., owing to a small number of shallow acceptors, the Fermi level of the undoped AlInAs layer is positioned in the vicinity of the conduction band, and electrons are excited from the donors which produce an energy level in the vicinity of the conduction band at room temperature among the shallow donors and the deep donors, thereby presenting the n type conductivity in a carrier concentration of $10^{16}$ cm$^{-3}$ (which is measured by the Hall measurement method).

By the way, as a current blocking layer, a high resistance buffer layer, or the like in InP series optical devices or electronic devices, one having a resistivity of about $5\times10^4$ Ω.cm is well employed. Generally, a compound semiconductor having a resistivity of $10^3$–$10^8$ Ω.cm is called a high resistance compound semiconductor.

However, the undoped AlInAs layer having a carrier concentration of $10^{16}$ cm$^{-3}$ that is crystalline grown by MOCVD has a resistivity of below 1 Ω.cm, and it cannot be employed for a current blocking layer, a high resistance buffer layer, or the like, which is required to be of a high resistance compound semiconductor layer.

In order to increase the resistance of a compound semiconductor while producing the same by MOCVD, it is well known to add Fe as a dopant to the compound semiconductor which would have a deep acceptor level. For example, Japanese Published Patent Application No.1-241817 discloses increasing the resistance of the AlGaAs layer by including Fe in the AlGaAs layer. Further, Japanese Journal of Applied Physics. Vol.31(1992), pp, L376–L378 Part 2, No.4A, 1 Apr. 1992, "Highly Resistive Iron-Doped AlInAs Layers Grown by Metalorganic Chemical Vapor Deposition", by H. Ishikawa, M. Kamada, H. Kawai and K. Kaneko, discloses adding Fe in a concentration of $2\times10^{17}$ atoms cm$^{-3}$ into the undoped AlInAs layer representing n type conductivity due to a residual carrier concentration of 1–$2\times10^{15}$ cm$^{-3}$ so as to obtain a high resistance AlInAs layer having a resistivity of $10^4$–$10^6$ Ω.cm.

In other words, the conventional high resistance AlInAs layer is obtained by performing crystal growth employing MBE or by performing crystal growth employing MOCVD while adding Fe.

As discussed above, the conventional high resistance compound semiconductor layer is formed by the above-described crystal growth method, and by performing crystal growth of undoped compound semiconductor employing MBE, a compound semiconductor of high resistance is obtained. However, the reason why the resistance is increased by employing the MBE is not yet clarified and this MBE method cannot be applied to phosphorus series compound semiconductors. On the other hand, when MOCVD is employed, a growth utilizing surface plane dependency such as a selective growth onto an insulating film can be performed and this method is applicable to both of phosphorus series compound semiconductor and arsenide series compound semiconductors. However, when a crystal growth of undoped compound semiconductor is performed, the compound semiconductor would unavoidably have n type conductivity. In order to compensate for this phenomenon, it is possible to increase the resistance of the compound semiconductor by adding Fe to the compound semiconductor as a dopant. The Fe is generally known to diffuse into the p type semiconductor which is formed adjacent the compound semiconductor at quite a high speed, thereby deteriorating the electrical and optical characteristics of the compound semiconductor crystal, and further deteriorating the reliability of electronic and optical devices employing them. Accordingly, the crystal growth method which adds Fe into the compound semiconductor and, the electronic and the optical devices including high resistance compound semiconductor layers which are obtained by that crystal growth method are not practical.

SUMMARY OF THE INVENTION

It is an object of the present invention to provide a compound semiconductor layer and a crystal growth method therefor that crystalline grows a high resistance compound semiconductor layer that is employed for InP series electronic and optical devices, and which can suppress the diffusion of impurities from the high resistance compound semiconductor layer obtained by the growth into other compound semiconductor layers.

It is another object of the present invention to provide a compound semiconductor layer and a crystal growth method therefor which do not deteriorate the characteristics of the electronic and optical devices including this high resistance compound semiconductor layer.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, a high resistance compound semiconductor layer included in a semiconductor device including a plurality of compound semiconductor layers having different compositions, includes a compound semiconductor that is vapor phase grown employing an organic metal compound including In, an organic metal compound including Al, and a hydrogenated compound or organic metal compound including As the high resistance compound semiconductor layer includes p type impurities having a concentration which positions the Fermi level of the compound semiconductor approximately at the center of the band gap of the compound semiconductor. Therefore, AlInAs presenting n type conductivity in its undoped state with increased resistance by cancelling its donor concentration is powdered, whereby a high resistance AlInAs layer which has less impurities which are diffused into a compound semiconductor layer that is adjacent thereto and that is grown by vapor phase crystal growth is obtained.

According to a second aspect of the present invention, a high resistance compound semiconductor layer including a compound semiconductor that is vapor phase grown employing an organic metal compound including In, an organic metal compound including Al, and a hydrogenated compound or an organic metal compound including As, includes impurities forming shallow acceptor levels to a concentration which positions the Fermi level of the compound semiconductor approximately at the center of the band gap of compound semiconductor. Therefore, AlInAs presenting n type conductivity in its undoped state with increased resistance by cancelling its shallow donor concentration is produced, whereby a high resistance AlInAs layer having less impurities which are diffused into a compound semiconductor layer that is adjacent thereto can be obtained by vapor phase growth.

According to a third aspect of the present invention, a high resistance compound semiconductor layer including a compound semiconductor that is vapor phase grown employing an organic metal compound including In, an organic metal compound including Al, and a hydrogenated compound or an organic metal compound including As, includes acceptor impurities of a IV group element in a concentration which positions the Fermi level of the compound semiconductor approximately at the center of the band gap of the compound semiconductor. Therefore, AlInAs presenting n type conductivity in its undoped state with increased resistance by cancelling its shallow donor concentration is produced, whereby a high resistance AlInAs layer having less impurities which are diffused into a compound semiconductor layer that is adjacent thereto can be obtained by vapor phase growth.

According to a fourth aspect of the present invention, the acceptor impurity of the Group IV element is carbon.

According to a fifth aspect of the present invention, a high resistance compound semiconductor layer including a compound semiconductor that is vapor phase grown employing an organic metal compound including In, an organic metal compound including Al, and a hydrogenated compound or an organic metal compound including As, includes acceptor impurities of a II group element to a concentration which positions the Fermi level of the compound semiconductor approximately at the center of the band gap of the compound semiconductor. Therefore, AlInAs presenting n type conductivity in its undoped state with increased resistance by cancelling its shallow donor concentration is produced, whereby a high resistance AlInAs layer having less impurities which are diffused into a compound semiconductor layer that is adjacent thereto can be obtained by vapor phase growth.

According to a sixth aspect of the present invention, the acceptor impurity of the Group II element is beryllium or magnesium which is taken into the compound semiconductor by doping.

According to a seventh aspect of the present invention, in addition to the acceptor impurities of the IV group element and the II group element, impurities having a concentration larger than ten times the concentration of the acceptor impurity and each forming a deep donor level are included. Therefore, AlInAs with increased resistance by broadening the control range of the Fermi-level is produced, whereby a high resistance AlInAs layer having less impurities which are diffused into a compound semiconductor layer that is adjacent thereto can be obtained by vapor phase growth.

According to an eighth aspect of the present invention, employed as the impurity forming the deep donor level is oxygen which is taken into the compound semiconductor by doping.

According to a ninth aspect of the present invention, a high resistance compound semiconductor layer including compound semiconductor crystal that is vapor phase grown employing an organic metal compound including In, organic metal including Al, an organic metal compound including Ga, and a hydrogenated compound or an organic metal compound including As, includes impurities each forming deep donor level or acceptor level having concentrations which position the Fermi level of the compound semiconductor approximately at the center of the band gap of the compound semiconductor. Therefore, the number of deep donors and acceptor levels in the obtained compound semiconductor mixture crystal is increased to form a lot of energy levels in the vicinity of the center of the band gap, and impurities each forming deep donor or acceptor level are president, resulting in that the Fermi-level is positioned approximately at the center of forbidden band, thereby providing a high resistance.

According to a tenth aspect of the present invention, employed as the impurity forming a deep donor or an acceptor level is oxygen which is taken into the compound semiconductor by doping.

According to an eleventh aspect of the present invention, in a method for crystalline growing a high resistance compound semiconductor layer in a semiconductor device including a plurality of compound semiconductor layers having different compositions, impurities of such a concentration that positions the Fermi-level of the compound semiconductor approximately at the center of the band gap are taken into the compound semiconductor The Crystal growth is a performed at a predetermined lower temperature by metal organic chemical vapor deposition employing an organic metal compound including In, an organic metal compound including Al, and hydrogenate or compound or an organic metal compound including As. Therefore, the AlInAs mixture crystal presenting n type conductivity in its undoped state with increased its resistance by cancelling its donor concentration is produced, whereby a high resistance AlInAs layer which has less impurities which are diffused into a compound semiconductor layer that is adjacent thereto can be obtained by vapor phase crystal growth.

According to a twelfth aspect of the present invention, in a method for crystalline growing a high resistance compound semiconductor layer in a semiconductor device including a plurality of compound semiconductor layers having different compositions, p type impurities of such a concentration that positions the Fermi-level of the compound semiconductor approximately at the center of the band gap energy are taken into the compound semiconductor The Crystal growth is a performed at a predetermined lower temperature by metal organic chemical vapor deposition employing an organic metal compound including In, an organic metal compound including Al, and hydrogenated compound or an organic metal organic including. Therefore, AlInAs presenting n type conductivity in its undoped state with increased its resistance by cancelling its donor concentration produced, whereby a high resistance AlInAs layer which has less impurities which are diffused into a compound semiconductor layer that is adjacent thereto can be obtained by vapor phase crystal growth.

According to a thirteenth aspect of the present invention, in a method for crystalline growing a high resistance compound semiconductor layer in a semiconductor device including a plurality of compound semiconductor layers having different compositions, impurities forming a shallow acceptor level of such a concentration that positions the Fermi-level of the compound semiconductor approximately at the center of the band gap are taken into the compound semiconductor The Crystal growth is performed at a predetermined lower temperature by metal organic chemical vapor deposition employing an organic metal compound including In, an organic metal compound including Al, and hydrogenated compound or an organic metal compound including As. Therefore, AlInAs presenting n type conductivity in its undoped state with increased resistance by cancelling its shallow donor concentration is produced, whereby a high resistance AlInAs layer which has less impurities which are diffused into a compound semiconductor layer that is adjacent thereto can be obtained by vapor phase crystal growth.

According to a fourteenth aspect of the present invention, in a method for crystalline growing a high resistance compound semiconductor layer in a semiconductor device including a plurality of compound semiconductor layers having different compositions, acceptor impurities of a Group IV element of such a concentration that positions the Fermi-level of the compound semiconductor approximately at the center of the band gap are taken into the compound mixture semiconductor growth at a predetermined lower temperature by metal organic chemical vapor deposition employing an organic metal compound including In, an organic metal compound including Al, and a hydrogenated compound or an organic metal compound including material. Therefore, AlInAs presenting n type conductivity in its undoped state with increased its resistance by cancelling its shallow donor concentration is produced, whereby a high resistance AlInAs layer which has less impurities which are diffused into a compound semiconductor layer that is adjacent thereto can be obtained by vapor phase crystal growth.

According to a fifteenth aspect of the present invention, the acceptor impurity of the Group IV element is carbon.

According to a sixteenth aspect of the present invention, in a method for crystalline growing a high resistance compound semiconductor layer in a semiconductor device including a plurality of compound semiconductor layers having different compositions, p type impurities of such a concentration that positions the Fermi-level of the compound semiconductor approximately at the center of the band gap are added to the compound semiconductor while performing crystal growth of the compound mixture semiconductor by an metal organic compound chemical vapor deposition employing an organic metal compound including In, an organic metal compound including Al, and hydrogenated compound or an organic metal compound including As. Therefore, AlInAs presenting n type conductivity in its undoped state with increased resistance by cancelling its shallow donor concentration is produced, whereby a high resistance AlInAs layer which has less impurities which are diffused into a compound semiconductor layer that is adjacent thereto can be obtained by vapor phase crystal growth.

According to a seventeenth aspect of the present invention, in a method for crystalline growing a high resistance compound semiconductor layer in a semiconductor device including a plurality of compound semiconductor layers having different compositions, impurities forming shallow acceptor levels of such a concentration that positions the Fermi-level of the compound semiconductor approximately at the center of the band gap are added to the compound semiconductor, while performing crystal growth of the compound semiconductor by metal organic chemical vapor deposition employing an organic metal compound including In, an organic metal compound including Al, and hydrogenated compound or an organic metal compound including As. Therefore, AlInAs presenting n type conductivity in its undoped state with increased its resistance by cancelling its shallow donor concentration is produced, whereby a high resistance AlInAs layer which has less impurities which are diffused into a compound semiconductor layer that is adjacent thereto can be obtained by vapor phase crystal growth.

According to an eighteenth aspect of the present invention, in a method for crystalline growing a high resistance compound semiconductor layer in a semiconductor device including a plurality of compound semiconductor layers having different compositions, acceptor impurities of Group IV element of such a concentration that positions the Fermi-level of the compound semiconductor approximately at the center of the band gap are added to the compound semiconductor while performing crystal growth of the compound mixture semiconductor by metal organic chemical vapor deposition employing an organic metal compound including In, an organic metal compound including Al, and hydrogenated compound or an organic metal compound including As. Therefore, AlInAs presenting n type conductivity in its undoped state with increased resistance by cancelling its shallow donor concentration is produced, whereby a high resistance AlInAs layer which has less impurities which are diffused into a compound semiconductor layer that is adjacent thereto can be obtained by vapor phase crystal growth.

According to a nineteenth aspect of the present invention, the doping acceptor impurity of the Group IV element is carbon.

According to a twentieth aspect of the present invention, in a method for crystalline growing a high resistance compound semiconductor layer in a semiconductor device including compound semiconductor layers having different compositions, acceptor impurities of a Group II element of such a concentration that positions the Fermi-level of the compound semiconductor approximately at the center of the band gap are add to the compound mixture semiconductor while performing crystal growth of the compound mixture semiconductor by metal organic chemical vapor deposition employing an organic metal compound including In, an organic metal compound including Al, and hydrogenated compound or an organic metal compound including As. Therefore, AlInAs presenting n type conductivity in its undoped state with increased resistance by cancelling its shallow donor is produced, whereby a high resistance AlInAs layer which has less impurities which are diffused into a compound semiconductor layer that is adjacent thereto can be obtained by vapor phase crystal growth.

According to a twenty-first aspect of the present invention, the doping acceptor impurity of the Group II element is beryllium or magnesium.

According to a twenty-second aspect of the present invention, in a method for crystalline growing a high resistance semiconductor layer including a plurality of compound semiconductor layers having different compositions in a semiconductor device, impurities forming a deep donor level are added, in addition to acceptor impurities of the a Group II element or a Group II element. Therefore, AlInAs crystal has increased resistance due to broadening the control range of the Fermi-level, whereby a high resistance AlInAs layer which has less impurities which are diffused into a compound semiconductor layer that is adjacent thereto can be obtained by vapor phase crystal growth.

According to a twenty-third aspect of the present invention, the doping impurity forming a deep donor level is oxygen.

According to a twenty-fourth aspect of the present invention, the concentration of oxygen is larger than ten times the concentration of the acceptor impurity.

According to a twenty-fifth aspect of the present invention, in a method for crystalline growing a high resistance compound semiconductor layer in a semiconductor device including a plurality of compound semiconductor layers having different compositions, impurities each forming a deep donor level or an acceptor level in such a concentration that position the Fermi-level of the compound semiconductor approximately at the center of the band gap are added to the compound mixture semiconductor while performing crystal growth of the compound mixture semiconductor by metal organic chemical vapor deposition employing an organic metal compound including In, organic metal compound including Al, and hydrogenated compound or an organic metal compound including As. Therefore, the number of deep donors and acceptor levels in the obtained compound semiconductor is increased to form a lot of energy levels in the vicinity of the center of the band gap, and impurities forming a deep donor or an acceptor level are added in that state, resulting in positioning of the Fermi-level approximately at the center of forbidden band, thereby providing a high resistance.

According to a twenty-sixth aspect of the present invention, the doping impurity forming a deep donor or an acceptor level is oxygen.

DETAILED DESCRIPTION OF THE PREFERRED EMBODIMENTS

Embodiment 1.

Figures 1A, 1B:
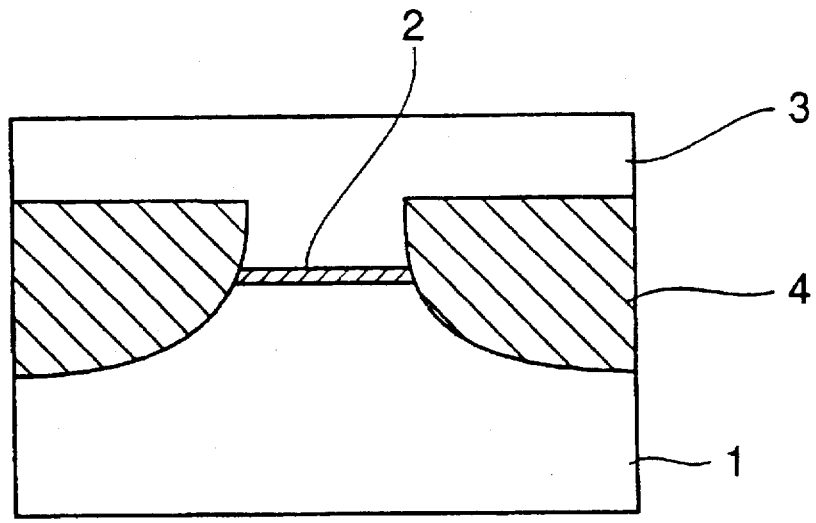
FIGS. 1(a) and 1(b) are a diagram illustrating the energy band of a high resistance AlInAs layer and a cross-sectional view of a semiconductor layer provided with the high resistance AlInAs layer, respectively, according to a first embodiment of the present invention.

FIGS. 1(a) is a diagram illustrating an energy band of a high resistance AlInAs layer that is obtained by crystal growth method according to a first embodiment of the present invention. In the figure, reference character Ec designates an energy level of a conduction band, reference character Ev designates an energy level of a valence band, reference character $E_{SD}$ designates an energy level of a shallow donor, reference character $E_A$ designates an energy level of a shallow acceptor, and reference character $E_{DD}$ designates an energy level of a deep donor, respectively. Reference character $N_{SD}$ designates a concentration of the shallow donor level, reference character $N_A$ designates a concentration of the shallow acceptor level, and reference character $N_{DD}$ designates a concentration of a deep donor level.

FIG. 1(b) is a cross-sectional view of a semiconductor laser showing its layer structure, with some simplification. The layer structure is fabricated by forming an n type InP layer 1, an active layer 2, and a p type InP layer 3, to etching the three layers 1, 2, and 3 to form a mesa, forming a high resistance AlInAs layer 4 serving as a current blocking layer at an etched portion, and further forming a p type InP layer 3 on the p type InP layer 3 and the high resistance AlInAs layer 4.

A description is given of a crystal growth method for growing the high resistance AlInAs layer 4.

First of all, a vertical type MOCVD furnace is employed as an apparatus for performing crystal growth. Trimethylindium (hereinafter referred as TMI), Trimethlaluminum (hereinafter referred as TMA), and alsine ($AsH_3$) (10 percent) are employed as materials, and these material gasses flow into the reaction furnace with flow rates of 19 cc/min, 2.5 cc/min, and 170 cc/min, respectively. The growth temperature of vapor phase crystal growth is set to a temperature of 500 ° C. which is lower than the normal growth temperature of about 600 ° C. ~700 ° C.

Figure 4:
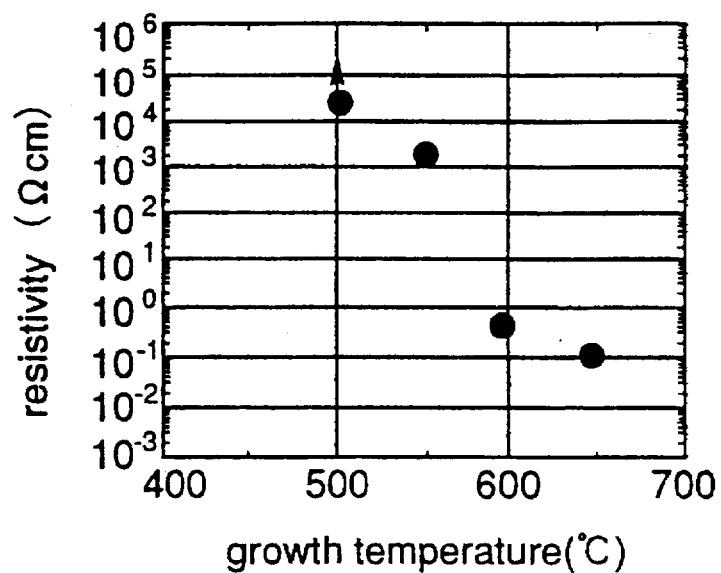
FIG. 4 is a diagram illustrating growth temperature dependency of resistivity at room temperature of AlInAs according to the first embodiment.

FIG. 4 shows a result obtained by carrying out vapor phase crystal growth with lowering the growth temperature of AlInAs from 650 ° C. successively by 50° C., and investigating the resistivity of AlInAs obtained by the above-described respective temperatures. As is found from these results, by carrying out vapor phase crystal growth at a low temperature of 500 ° C., it is possible to obtain a high resistance AlInAs layer 4 having a resistivity of $5 \times 10^4$ Ω.cm.

A description is given of a mechanism of obtaining high resistivity by lowering the growth temperature.

Figure 2:
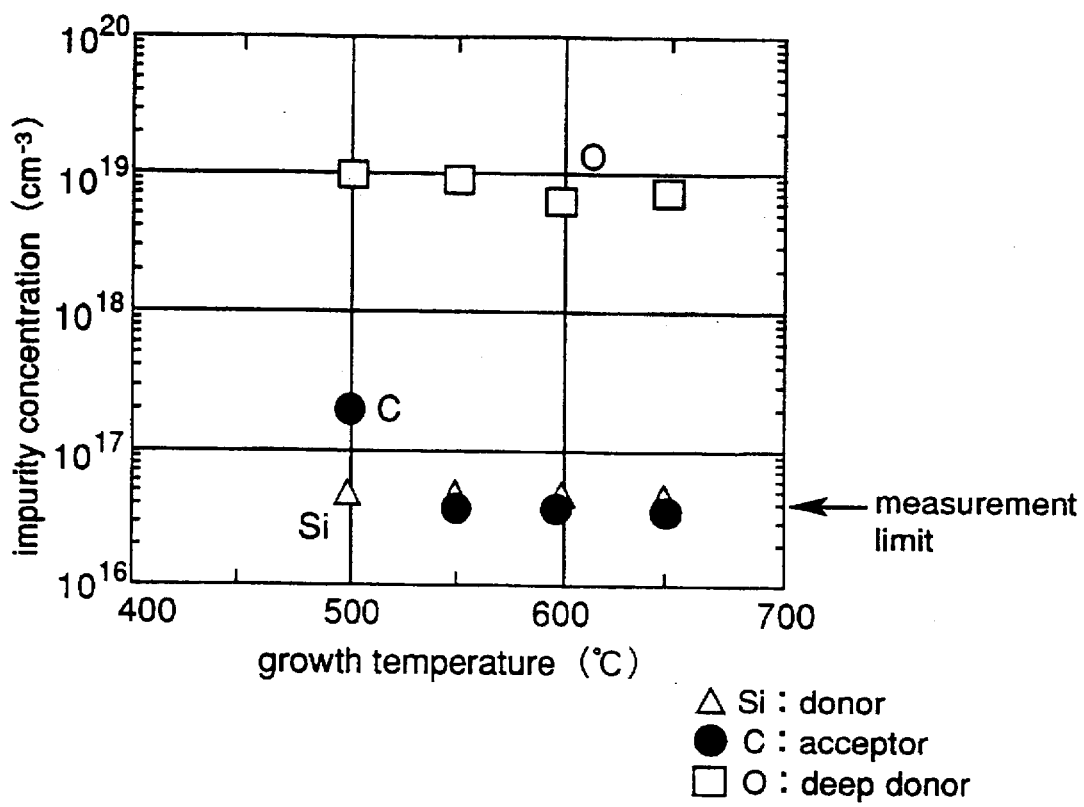
FIG. 2 is a diagram illustrating growth temperature dependency of impurity concentration according to the first embodiment.

FIG. 2 shows a change of impurity concentration in the compound semiconductor relative to the growth temperature of the compound semiconductor, that is, the result of analyzing the growth temperature dependency of impurity concentration by SIMS (secondary ion mass spectroscopy) method. From this figure, the concentration of oxygen as a deep donor rather increases by performing crystal growth at 500 ° C., as well as the concentration of carbon (C) which is a p type impurity and an acceptor increases.

Figure 3:
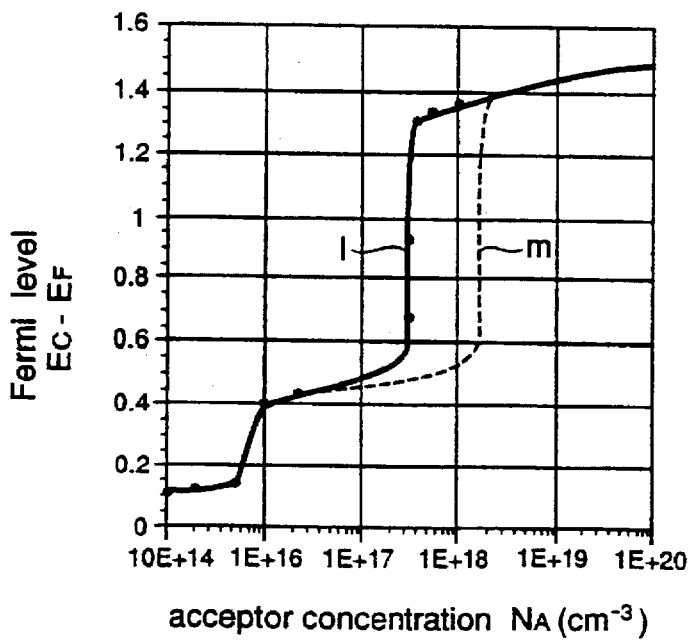
FIG. 3 is a diagram illustrating a relation between the acceptor concentration and the Fermi level in the first embodiment.

FIG. 3 is a diagram illustrating a relation between shallow acceptor concentration $N_A$ and Fermi-level Ec-$E_F$, and it represents a change of the Fermi-level of AlInAs when crystal growth of AlInAs is carried out at a normal crystal growth temperature of about 600 ° C. to 700 ° C. while adding Zn which has a level of shallow acceptor level $E_A$ like carbon, and thereby increasing Zn concentration. From the solid line 1 shown in FIG. 3, in the range of the acceptor concentration $N_A$ from $2 \times 10^{16}$ cm$^{-3}$ to $3 \times 10^{16}$ cm$^{-3}$, the Fermi-level Ec-$E_F$ smoothly varies from 430 to 600 meV. However, as described in Journal of Crystal Growth 131 (1993) P.186-192 cited in the description of prior art, there exist a lot of donor levels $E_{DD}$ formed by oxygen in the undoped AlInAs. While in the above-described FIG. 3, in order to ease the understanding of the change of Fermi-level Ec-$E_F$ by increasing the acceptor concentration $N_A$, the level of Ec-$E_{DD}$=500 meV and the donor concentration $N_{DD}$=$3 \times 10^{17}$ cm$^{-3}$ which is one of the donor levels is represented. And the concentration of undoped AlInAs $N_{SD}$-$N_A$ is about $1 \times 10^{16}$ cm$^{-3}$. Here, even when there exist a lot of donors which have shallower levels than Ec-$E_{DD}$=500 meV, only the stepwise changes of the Fermi-levels Ec-$E_F$ increase by the number of the levels, and the controllability of the acceptor concentration $N_A$, while increasing the resistance of AlInAs, is not deteriorated. Besides, when the deep donor concentration $N_{DD}$ is increased, a relation between the acceptor concentration $N_A$ and the Fermi-level Ec-$E_F$ becomes as shown by a broken line m in FIG. 3, and this means broadening at the control range of the acceptor concentration $N_A$.

In other words, in order to increase the resistance of the compound semiconductor, it is required to position the Fermi-level of the compound semiconductor position approximately at the center of the forbidden band. And when the AlInAs which has a forbidden band of 1.45 eV increases in resistance, it is preferable to make the Fermi-level about 0.45~1.0 eV, and by performing crystal growth at 500° C., the donor concentration $N_{DD}$ due to oxygen rather increases, the amount of carbon taken into the crystal and forming a shallow acceptor level increases, thereby increasing the carbon concentration. And the increase in the carbon concentration reduces the concentration which is obtained by subtracting the acceptor concentration $N_A$ from the shallow donor concentration $N_{SD}$, thereby lowering the Fermi-level of the above-described AlInAs. When the acceptor concentration due to the carbon becomes about $2 \times 10^{16}$ cm$^{-3}$, the Fermi-level of AlInAs becomes 430 meV, and thereby a high resistance AlInAs of resistivity $5 \times 10^4$ Ω.cm is obtained as AlInAs.

In the above-described first embodiment, because the vapor phase growth of is carried out at a growth temperature of 500 ° C. employing an MOCVD apparatus and using TMI, TMA, and $AsH_3$, the amount of carbon as a p type impurity forming a shallow acceptor level which is taken into the crystal increases and it increases the acceptor concentration $N_A$, thereby lowering the Fermi-level of the crystal, and thereby positioning the Fermi-level of the AlInAs formed by the vapor phase crystal growth position in the vicinity of 0.5 eV that is, approximately the center of the band gap energy, resulting in a high resistance AlInAs. Therefore, even when the high resistance AlInAs prepared by the vapor phase crystal growth is used for the current blocking layer 4 of a semiconductor laser as shown in FIG. 1(b), it is possible to obtain a high resistance. AlInAs layer 4 that does not invite deterioration of device characteristics due to impurity diffusion arising in the adjacent p type InP layers 3 as in the prior art Fe doped high resistance AlInAs.

While in the above-described first embodiment TMI, TMA, and $AsH_3$ are used as materials for the crystal growth, an organic metal compound including In, an organic metal compound including Al, or a hydrogenated compound or an organic metal including As, may be employed. For example, TEI or TEA respectively having an ethyl base may be employed in place of the above-described TMI or TMA, and TBA may be employed in place of $AsH_3$.

Embodiment 2.

In the above-described first embodiment, the growth temperature when the AlInAs mixture crystal is vapor phase grown is lower than the normal growth temperature of 600 ° C.~700 ° C., and the concentration of carbon forming a shallow acceptor level which is naturally introduced into the crystal is increased to heighten the resistance. On the contrary, this second embodiment increases the resistance of the mixture crystal by introducing acceptor materials from a bubbler into a reaction tube.

Figure 5:
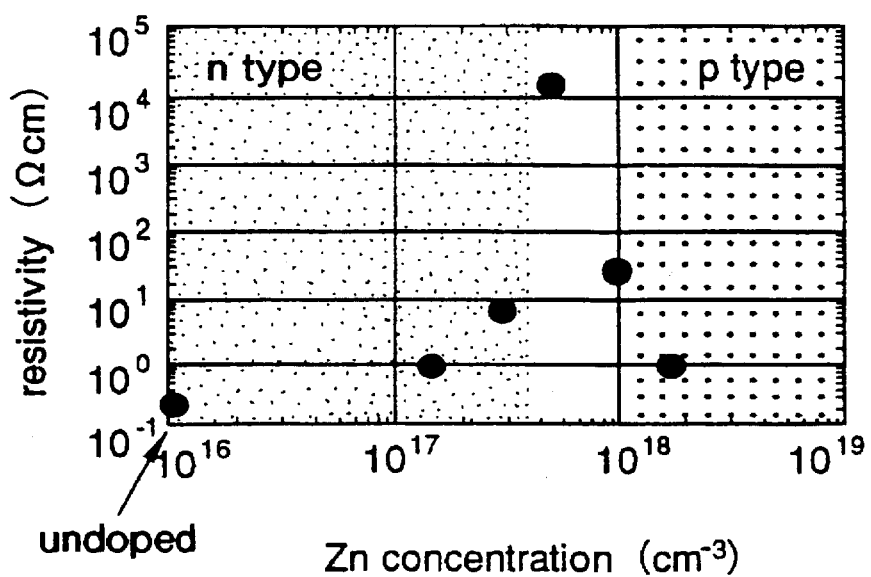
FIG. 5 is a diagram illustrating Zn concentration dependency of the resistivity of Zn doped AlInAs for explaining the second and the third embodiments.

FIG. 5 shows a graph showing the result of investigating the Zn concentration dependency of resistivity in AlInAs when Zn an acceptor material is added to the AlInAs. From this figure, when the Zn concentration is increased by gradually increasing the doping amount in the undoped AlInAs showing n type conductivity, the resistivity also gradually increases. And it becomes a high resistance AlInAs when the Zn concentration becomes about $5 \times 10^{17}$ cm$^{-3}$, and when the Zn concentration is further, it becomes AlInAs showing p type conductivity.

Figure 6:
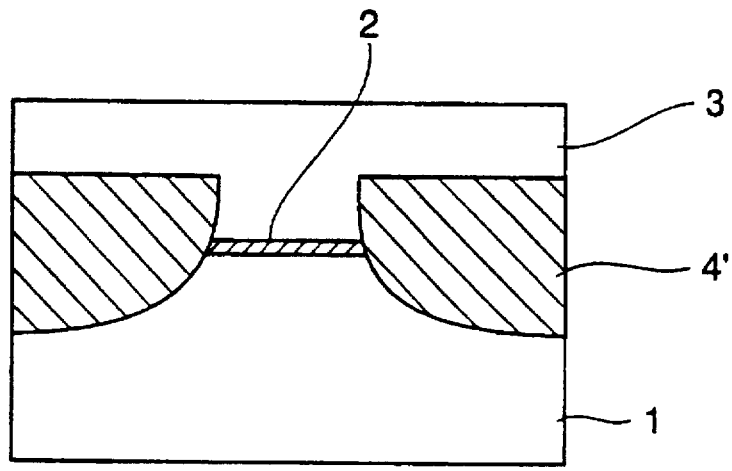
FIG. 6 is a cross-sectional view illustrating a semiconductor laser provided with a Zn doped AlInAs layer for explaining the second and the third embodiments.

However, the Zn doped AlInAs that is crystalline grown employing Zn as an acceptor results in the diffusion of Zn to other layers (or a reverse phenomenon occurs ) when this AlInAs is employed for a current blocking layer 4' in a semiconductor laser as shown in FIG. 6, and the concentration of Zn included in the layer 4' decreases (increases) to lower its resistivity, and thereby the resistivity of both sides of the active layer 2 decreases. Therefore the current component flowing at the sides of the active layer and not contributing to the laser oscillation increases, thereby deteriorating the laser characteristics.

In this second embodiment beryllium is a p type impurity which is not likely to diffuse in comparison with Zn and which forms a shallow acceptor level as carbon in the above-described first embodiment and is employed as a dopant.

In other words, by employing TMI, TMA, or AsH$_3$ as a material for crystalline growing AlInAs by MOCVD as in the first embodiment, and introducing Be(CH$_3$C$_5$H$_4$)$_2$ (bis-methyl cyclopentadienyl beryllium) which is an organic metal compound including Be from a bubbler into a reaction tube, and doping Be at a growth temperature of 600 ° C. and in a range of concentration from $2\times10^{16}$ cm$^{-3}$ to $3\times10^{17}$ cm$^{-3}$, the Fermi-level of the crystal formed by the vapor phase growth can be controlled to the vicinity of 0.5 eV, thereby providing high resistance AlInAs.

Besides, even by adding beryllium employing DEBe (diethyl beryllium) as an organic metal including beryllium, it is also possible to position the Fermi-level position in the vicinity of 0.5 eV, thereby providing high resistance AlInAs.
Embodiment 3.

A third embodiment of the present invention carries out a vapor phase crystal growth of AlInAs mixture crystal at a growth temperature of 600 ° C. by MOCVD as shown in the second embodiment, employing magnesium as a dopant.

Mg(CH$_3$C$_5$H$_4$)$_2$ (bis-methyl cyclopentadienyl magnesium) is employed as an organic metal compound including magnesium, and the concentration of doped Mg is in the range of from $2\times10^{16}$ cm$^{-3}$ to $3\times10^{17}$ cm$^{-3}$.

Also in this third embodiment, because magnesium is a p type impurity which has a low diffusion coefficient and which forms a shallow acceptor level is added to the crystal that is vapor phase grown so that the Fermi-level thereof is positioned approximately at the center of the band gap, it is possible to obtain a high resistance AlInAs layer that does not deteriorate the device characteristics.

The reasons why the AlInAs can be increased in resistivity in the second and the third embodiments is the p type impurities forming shallow acceptor levels lower the Fermi-level with killing with the shallow donors do not depend on the doping method. Thus it is possible to add magnesium or beryllium by a doping method generally known, and it is possible to obtain the same effects regardless of the doping method employed. In addition, it is possible to introduce carbon that has a low diffusion coefficient in comparison with the two p type impurities into the crystal by doping, not by natural incorporation into the crystal by lowering the growth temperature.
Embodiment 4.

In the above-described first to third embodiments, the oxygen forming a deep donor level is naturally taken into the crystal from residual oxygen and H$_2$O in the MOCVD apparatus. In this fourth embodiment the oxygen concentration in the crystal can be controlled by doping with oxygen gas.

In other words, oxygen gas of 100 ppm in He is introduced into the reaction tube of the MOCVD apparatus together with TMA, TMI, AH$_3$, and Be(CH$_3$C$_5$H$_4$)$_2$, thereby to grow an AlInAs layer doped with oxygen and Be by vapor phase growth. Then, the donor concentration becomes about one-tenth in comparison with the oxygen doping amount, and the oxygen doping is more than ten times of the beryllium doping.

In this fourth embodiment, because the oxygen concentration in the crystal is heightened by the doping, the control range of the Fermi-level of the AlInAs mixture crystal that is formed by the vapor phase crystal growth can be enlarged, thereby obtaining a high resistance AlInAs layer.

While in this fourth embodiment beryllium is employed as an acceptor, it is not limited to beryllium. Magnesium or carbon used in the third embodiment can be employed with the same effects as described above.
Embodiment 5.

A fifth embodiment of the present invention introduces oxygen by bubbling H$_2$O or Al(CH$_3$)$_3$ (trimethoxy aluminum) with hydrogen in place of introducing oxygen gas. Then, because the vapor pressure of methoxy aluminum is quite small as 0.14 mmHg at 20 ° C. relative to the vapor pressure of TMA (9.2 mmHg), it has no influences on the composition of AlInAs.

Also in this fifth embodiment, the same effect as in the fourth embodiment can be obtained.
Embodiment 6.

Figure 7:
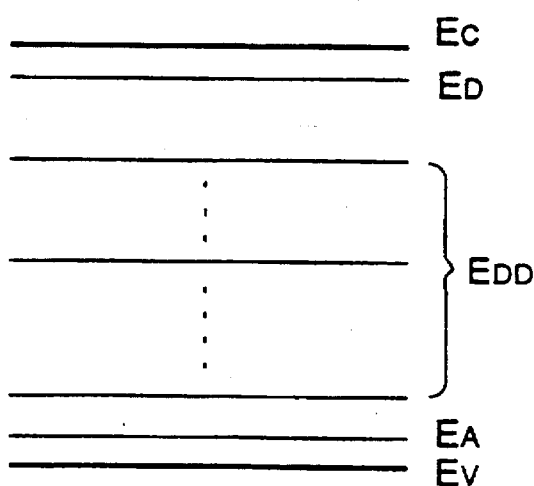
FIG. 7 is a diagram illustrating the energy band of a high resistance AlInAs layer according to a sixth embodiment of the present invention.

In the above-described first to fifth embodiments, by introducing p type impurities forming a shallow acceptor level E$_A$, the Fermi-level of the AlInAs mixture crystal that is grown by vapor phase crystal growth is positioned at the center of the band gap of the crystal. In this sixth embodiment, Ga is added to increase the number of the deep donor level E$_{DD}$ that are formed by the oxygen as shown in FIG. 7, thereby to increase the resistance of the AlInAs.

In other words, the oxygen level E$_T$ of the AlInAs of a composition lattice matching with the InP substrate which is well used in the InP system optical or electronic device is 0.3, 0.45, 0.05 eV, but when Ga is added to the AlInAs to produce AlGaInAs having a composition of (Al$_y$Ga$_{1-y}$)$_x$In$_{1-x}$As (x=0.48, 0<y<1) which lattice matches with the InP substrate as the above-described AlInAs, the level that is formed by the oxygen becomes deeper and increases, and thereby forming a lot of levels from E$_c$ -E$_T$=0.4 eV to E$_A$-ET=0.14 eV. Accordingly, when oxygen is doped into the above-described AlGaInAs, because deep donors and deep acceptors exist in the AlGaInAs, the Fermi-level of the crystal is positioned at the center of the band gap energy, thereby easily producing a high resistance AlGaInAs layer.

While the above-described AlGaInAs has a composition of (Al$_y$Ga$_{1-y}$)$_x$In$_{1-x}$As (x=0.48, 0<y<1) which lattice matches with an InP substrate, the AlGaInAs is not limited to the composition that lattice matches with the InP substrate, and it is possible to obtain a high resistance AlGaInAs layer by the growth method of the above-described sixth embodiment.
Embodiment 7.

A seventh embodiment of the present invention produces a long wavelength semiconductor laser employing a high resistance compound semiconductor layer formed according to the first to sixth embodiments.

First of all, a structure and a method of fabricating a prior art long wavelength semiconductor laser will be described. FIGS. 8(a)–8(d) are diagrams for explaining a structure and a method of fabricating a prior art long wavelength semiconductor laser. In the figure, reference numeral 100 designates an n type InP substrate. Numeral 1 designates an n type InP layer formed on the n type InP substrate 100. Numeral 2 designates an active layer between the n type InP layer 1 and the p type InP layer 3. Numeral 200 designates a p type InGaAsP contact layer disposed on the p type InP layer 3a. Numeral 10 designates an Fe doped InP high resistance layer for realizing a current confinement structure. This Fe doped InP high resistance layer is most widely utilized a high resistance layer in which a resistivity of about $10^8$ $\Omega$cm can be obtained by increasing the Fe concentration to $10^{16}$ cm$^{-3}$.

A description is given of a method of fabricating a long wavelength semiconductor laser.

First of all, on an n type InP substrate 100, an n type InP layer 20, an undoped layer 30, a p type InP layer 40 are successively grown employing MOCVD, and subsequently an SiO$_2$ film is grown by sputtering and an SiO$_2$ stripe 50 is formed by employing conventional photolithography techniques (FIG. 8(a)).

Figure 8:
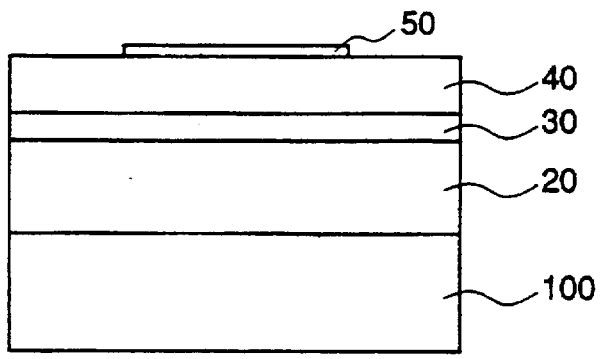
FIG. 8(a)–8(d) are diagrams for explaining a method of fabricating a long wavelength semiconductor LD employing a conventional high resistance burying layer.
Figure 8:
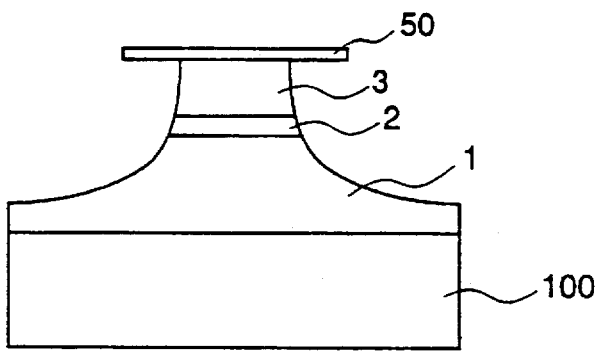
Figure 8:
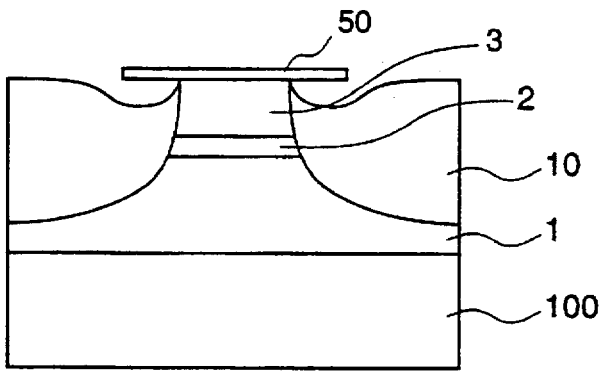
Figure 8:
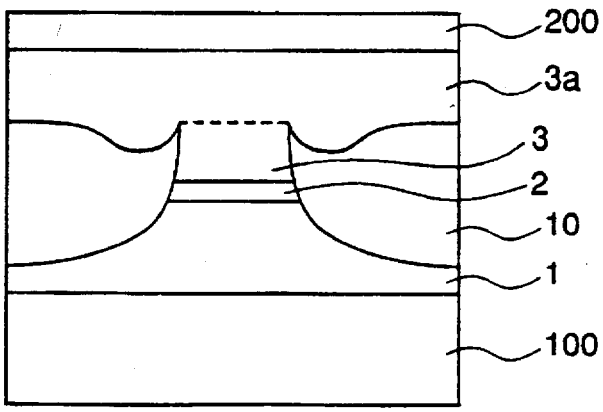

Next, employing the SiO$_2$ stripe 50 as a mask a mesa comprising the semiconductor layers as shown in FIG. 8(b) is formed by wet etching, and thereafter MOCVD is employed to grow the of Fe-InP layer 10 at both sides of the mesa (FIG. 8(c)).

Thereafter, after removing the SiO$_2$ stripe 50 by HF, MOCVD is again employed to successively grow a p type InP layer 3a and a p type InGaAsP contact layer 200 (FIG. 8(d)).

The long wavelength semiconductor laser formed as described above can concentrate the injection current at the active layer 2 by providing the both sides of at active layer 2 the Fe-InP layer 10 as a high resistance layer as shown in FIG. 8(d) and can confine the light efficiently in the active layer 2 because the refractive index of the Fe-InP layer 10 is smaller than that of the active layer 2, thereby enhancing the laser characteristics. However, it has the following problems.

Figure 9:
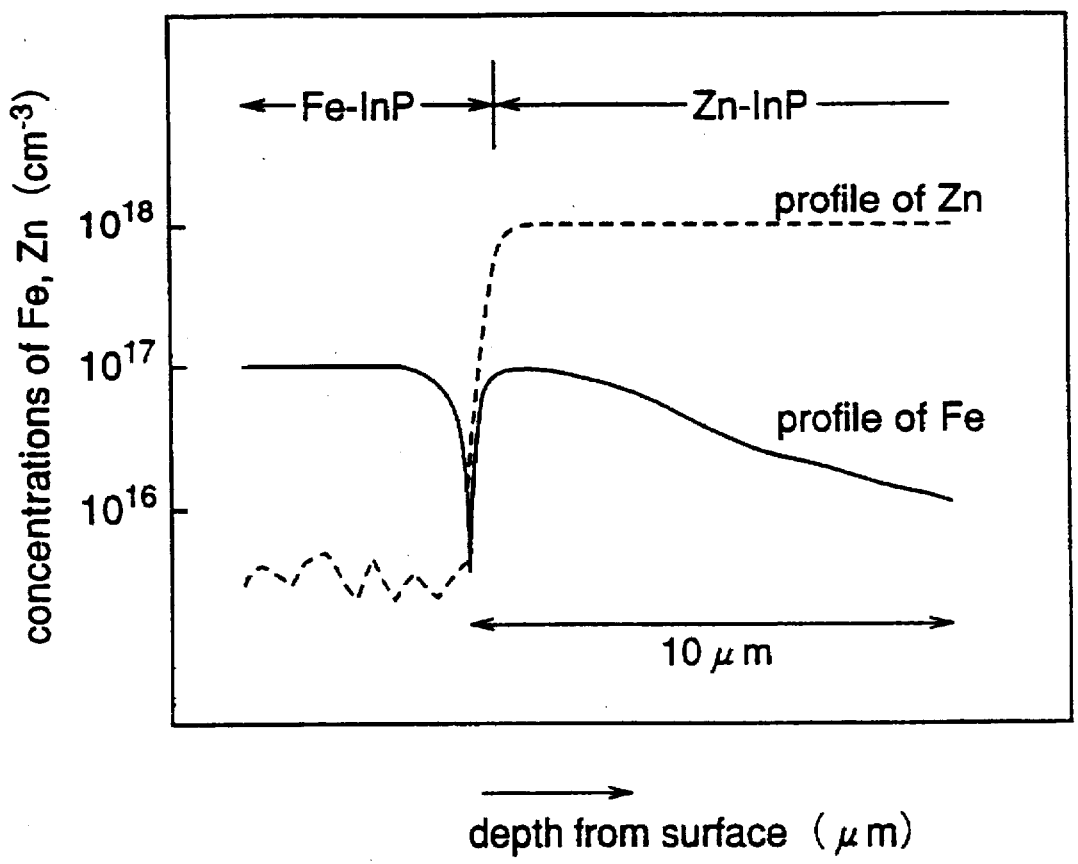
FIG. 9 is a diagram showing the result of SIMS analysis for the distributions of respective dopants (Fe, Zn) in the crystal when the Fe-InP layer and the p-InP (dopant Zn) layer are adjacent to each other.
Figure 10:
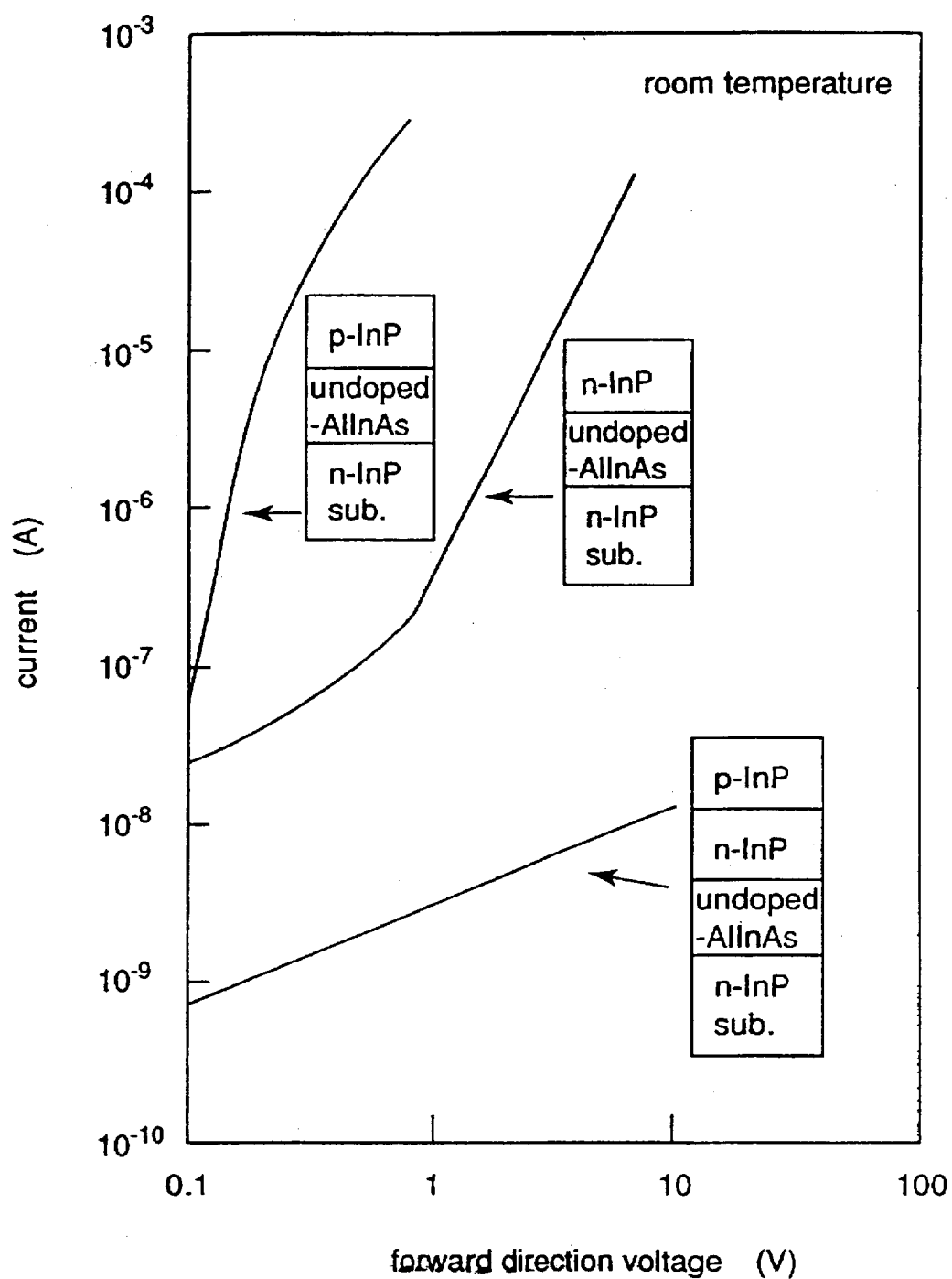
FIG. 10 is a diagram illustrating current vs voltage characteristics depending on the difference of the upper and lower structures of the AlInAs layer for explaining a seventh embodiment of the present invention.

FIG. 9 is a diagram showing the result of SIMS (secondary ion mass spectroscopy) analysis for the distribution of respective dopants (Fe, Zn) in the crystal when the Fe-InP layer and the p type InP (dopant Zn) layer are adjacent to each other. In the figure, the abscissa represents depth from the surface and the ordinate represents Fe and Zn concentrations. The solid line and the dotted line respectively represent Fe and Zn profiles. From this figure, Fe is diffused into the Zn-InP layer to about 10 µm, and the Fe concentration then is about $10^{17}$ cm$^{-3}$ which is close to the solubility limit of Fe in InP.

More particularly, in the case of the laser structure shown in the above-described long wavelength semiconductor laser (FIG. 8(d)), due to the diffusion of Fe from the Fe-InP layer 10 to the p type InP layer 3 and the active layer 2 and the diffusion of Zn from the p type InP layer 3 to the active layer 2, the electrical and optical characteristics of the laser are deteriorated.

A long wavelength semiconductor laser of this seventh embodiment will be described.

First of an all, electrical characteristics of undoped AlInAs layer that is crystalline grown by MOCVD at a growth temperature of 500° C. will be described. After growing an undoped Al$_{0.48}$In$_{0.52}$As layer on an n type InP substrate at a growth temperature of 500° C. to a 3 µm, thickness n type and a p type InP layers are respectively grown to a 0.5 µm thickness at a growth temperature of 650° C., thereby forming a p-n-i-n structure. This is processed to form a mesa shape and the current vs voltage characteristics is compared with the n-i-n structure and the p-i-n structure. FIG. 1 shows a current vs voltage characteristics of respective structures.

In the n-i-n structure since only electrons are injected into the undoped AlInAs layer, it is of high resistance having a resistivity of $2\times10^8$ $\Omega$cm while in the p-i-n structure since electrons and holes are respectively injected into the undoped AlInAs layer and recombined, the resistivity of the undoped AlInAs layer is below 1 $\Psi$cm. On the other hand, since in the p-n-i-n structure the injection of holes into the undoped AlInAs layer is suppressed by the n type InP layer between the p type InP layer and the undoped AlInAs layer, a high resistivity of above $1\times10^{10}$ $\Omega$cm is obtained.

Accordingly, in order to employ an AlInAs layer as a current blocking layer of a long wavelength LD, it is necessary to have a burying structure of p-n-i-n structure. However, in cases of utilizing electrons and holes as singles in electronic devices, it is not limited thereto.

A fabricating process of a long wavelength LD that employs an AlInAs layer as a current blocking layer and has a burying p-n-i-n structure will be described with reference to FIGS. 11(a)–11(d).

On the n type InP substrate 100, an n type InP layer 1 1 µm thick and having an impurity concentration of $1\times10^{18}$ cm$^{-3}$, an active layer 2 0.1 µm thick, a p type InP layer 3 0.5 µm thick and having an impurity concentration of $1\times10^{18}$ cm$^{-3}$ are successively grown by MOCVD at a growth temperature of 600° C. (FIG. 11(a)). Subsequently, an SiO$_2$ film is grown on the surface by sputtering, and an SiO$_2$ stripe 50 is formed in the (110) direction employing conventional photolithography techniques. Next, by employing an HBr etching solution, a mesa is formed (FIG. 11(b)). Again employing MOCVD, an undoped AlInAs layer 6 3 µm thick and of high resistance is grown at a growth temperature of 500° C., and then an n type InP current blocking layer 7 0.5 µm thick and a carrier concentration of $1\times10^{18}$ cm$^{-3}$ is selectively grown at a growth temperature of 600° C. without growing polycrystalline material on the SiO$_2$ stripe 5 (FIG. 11(c)). After removing the SiO$_2$ stripe 5 by with HF, the p type InP layer 3a 1 µm thick and having an impurity concentration of $1\times10^{18}$ cm$^{-3}$ and a p type InGaAs contact layer 200 1 µm thick and having an impurity concentration of 1 $\times10^{19}$ cm$^{-3}$ are again grown by MOCVD, thereby fabricating a long wavelength LD structure (FIG. 11(d)).

Figure 11:
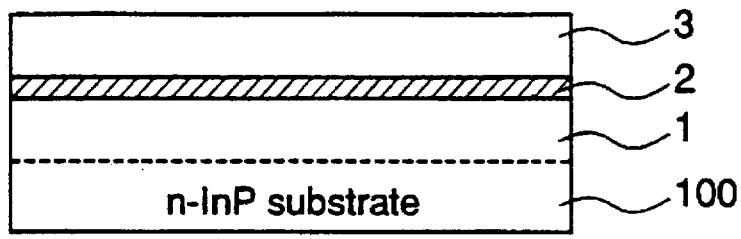
FIGS. 11(a)–11(d) are cross-sectional views illustrating a method of fabricating a long wavelength semiconductor laser device according to a seventh embodiment of the present invention.
Figure 11:
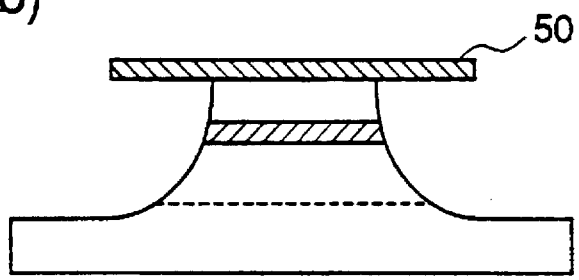
Figure 11:
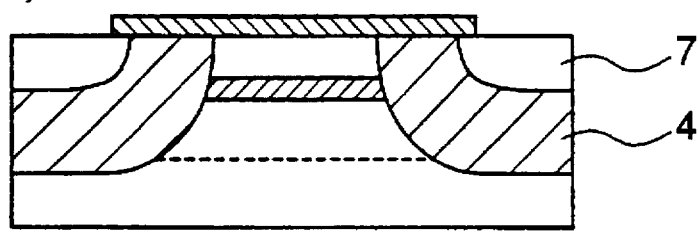
Figure 11:
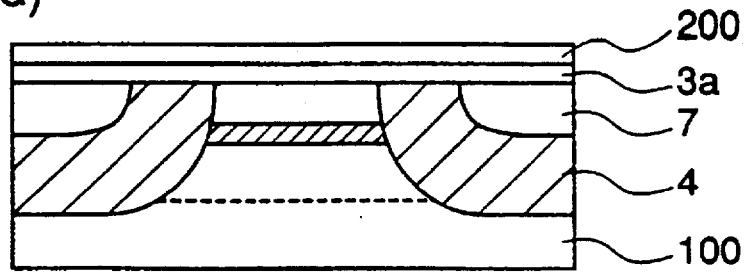
Figure 12:
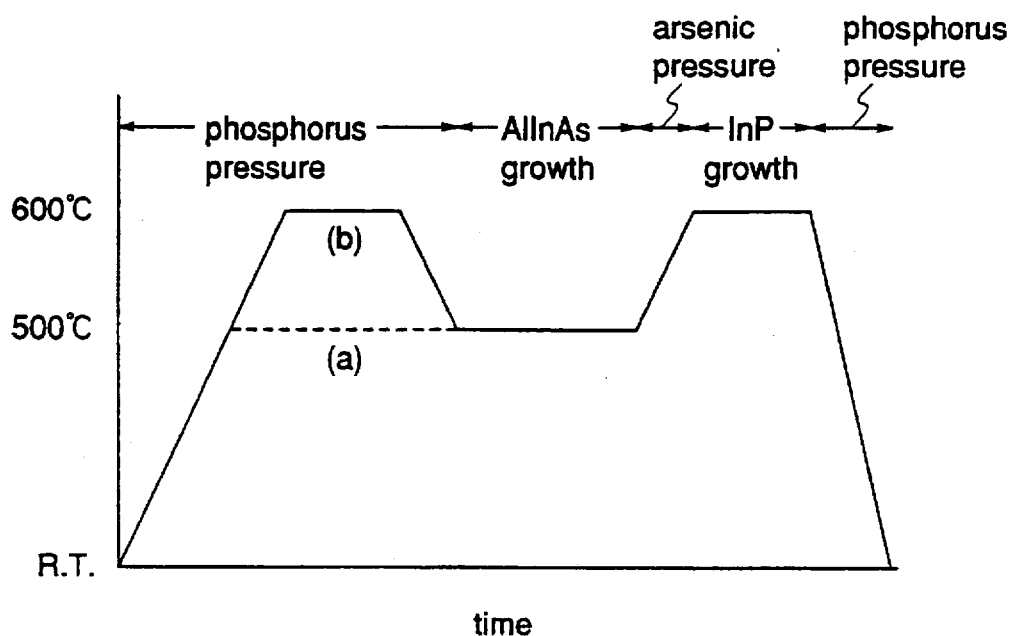
FIG. 12 is a temperature profile before growing the AlInAs burying layer in the seventh embodiment.

The point in this fabricating method is a process of FIG. 11(c). The growth temperature profile then is shown in FIG. 12. Usually, as described in the first embodiment, the growth is started after raising the temperature to 500° C. which is the growth temperature of the high resistance undoped AlInAs layer 4, under phosphine pressure (profile a). In this case, however, the undoped AlInAs layer 4 can only be selectively grown to about 1 µm (in view of time, about 1 hour). When further growth for film is tried, polycrystalline material is deposited on the SiO$_2$ stripe 50. In order to perform a high speed laser operation, the parasitic capacitance of the laser is required to be reduced, and in order for that, the undoped AlInAs layer 4 has to be as thick as possible. For example, if the frequency of the laser is 2.5 to 10 Gb/s, the film thickness of the undoped AlInAs layer 4 is required to be about 3 µm.

When after raising the temperature of the substrate higher than the growth temperature of the undoped AlInAs layer (for example, at 600° C.) and the temperature is lowered to 500° C., the growth is carried out, the undoped AlInAs layer 4 can be grown without precipitating polycrystalline material on the SiO$_2$ stripe 5 to a thickness of about 3 µm (profile b).

This is because the phosphorus atom (or hydrogen atom) that is resolved from phosphine (PH$_3$) before growth covers the SiO$_2$ stripe over the entire surface, and suppresses polysilicon from attaching to the SiO$_2$ film. Because resolution of PH$_3$ is promoted by increasing the temperature at which PH$_3$ flows before growing the undoped AlInAs layer 4, the profile (b) shown in FIG. 12 can selectively grow the undoped AlInAs layer 4 thicker than in the profile (b) shown in FIG. 12.

As discussed above, in order to carry out selective growth of an AlInAs layer at a low temperature of 500° C. without polycrystalline material being attached to the SiO$_2$ stripe 5, the temperature profile before the growth is quite important.

Figure 13:
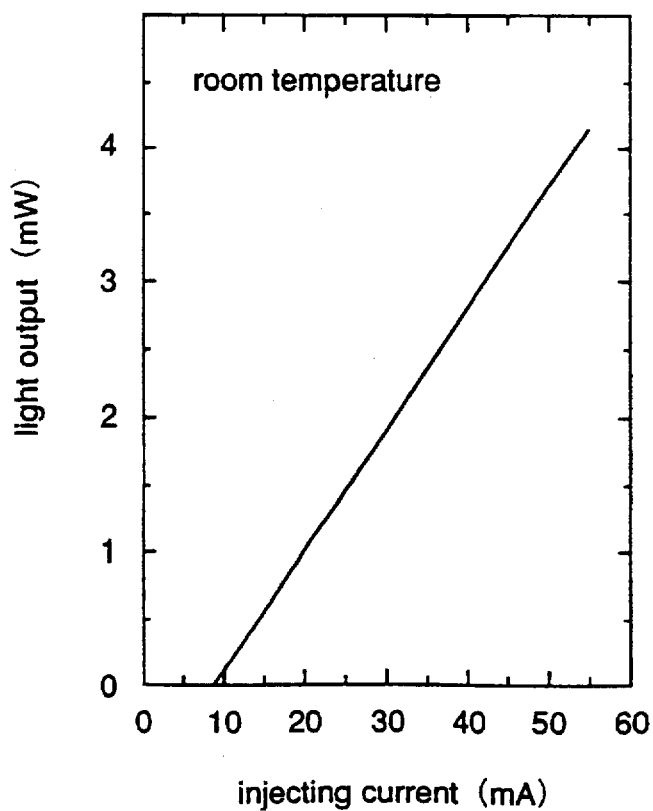
FIG. 13 is a diagram illustrating the light output-injection current characteristics of a long wavelength semiconductor laser according to a seventh embodiment of the present invention.
Figure 14:
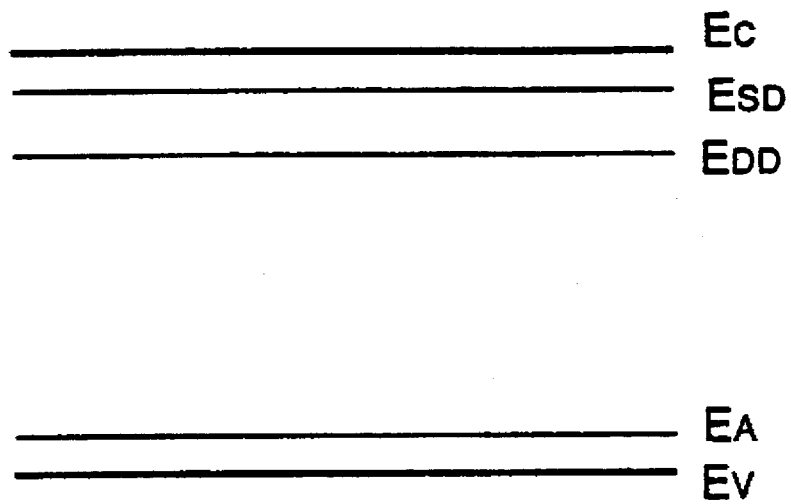
FIG. 14 is a diagram illustrating an energy band diagram of an undoped AlInAs layer.

The optical output/injection current characteristics of a long wavelength LD fabricated by the fabricating method of this embodiment are shown in FIG. 13. This figure shows that the long wavelength LD oscillates at a threshold current of 8 mA with good characteristics obtained.

In the seventh embodiment described, in a fabricating process of a long wavelength LD in which an undoped AlInAs layer is employed as a current blocking layer and a burying structure is made of a p-n-i-n structure, the selective burying growth of undoped AlInAs layer 4 is carried out after raising the temperature of the substrate to a higher temperature than the growth temperature (500° C.) and then reducing the temperature to 500° C., the temperature at the flowing PH$_3$ before growing the undoped AlInAs layer 4 is increased, the resolution from phosphine to phosphorus atoms (or hydrogen atoms) is promoted, whereby the phosphorus atoms (or hydrogen atoms) do not cover the SiO$_2$ stripe 5 over the entire surface and polycrystalline material attaches to the SiO$_2$ film. Therefore, the film of the undoped AlInAs layer 4 can be selectively grown to be thick, thereby resulting a long wavelength LD that can perform a high speed operation.

In addition, dopants which are quite likely to diffuse, such as Fe in the Fe-InP layer, are not included in the undoped AlInAs layer 4. Therefore, by employing Be, which is not as likely to diffuse as Zn for the p type dopant in the p type InP layer, the amount of impurities which are diffused into the active layer 3 can be suppressed, whereby a long wavelength LD can be fabricated so as to have an impurity profile in accordance with the design.

In the above-described seventh embodiment SiO$_2$ films are employed as a mask, SiO$_{1-x}$N$_x$ (0<x≦1) film may be employed with the same effect.

Embodiment 8.

In the above-described seventh embodiment by changing the temperature profile before growing the undoped AlInAs layer 4, the burying layer thickness of the undoped AlInAs layer 4 is made thick. In this case, the temperature for selective burying growth is quite narrow, 500°±25° C., as described in the seventh embodiment. This embodiment broadens the growth temperature range by adding an etching gas in a minute amount during the growth.

A description is given of a long wavelength semiconductor laser of this eighth embodiment.

In the growth of the undoped AlInAs layer 4 shown in FIG. 11(c), a growth is carried out by adding HCl gas (or Cl$_2$ gas) to about 5 to 20 cc/min. Then, the temperature raising profile may be either of that shown in FIG. 3(a) or that shown in FIG. 3(b). Because HCl has an effect removing material which serves as a core of polycrystalline material attached to the SiO$_2$ stripe 50, the temperature range in which the selective burying growth can be performed can be widened up to 475° to 600° C.

In addition, while removing the SiO$_2$ stripe 50 from the structure of FIG. 11(c), the surface exposed portion of the undoped AlInAs layer 4 (a portion at which the SiO$_2$ stripe 50 and the undoped AlInAs layer 6 are in contact with each other) are likely to be oxidized. If the oxidized region is wide, the p type InP layer 3a will not be grown flat. Therefore, by lightly etching the surface layer that is oxidized by flowing HCl gas therealong before growing the p type InP layer 3a, the p type InP layer 8 can be grown flat.

In this eighth embodiment, in a process of fabricating a long wavelength LD having an undoped AlInAs layer for the current blocking layer and a burying a p-n-i-n structure, the selective burying growth of the undoped AlInAs layer 4 is carried out with adding HCl gas (or Cl$_2$ gas) by about 5 to 20 cc/min, whereby the HCl can to remove the material serving as a core of polycrystalline material attached to the SiO$_2$ stripe 50, thereby broadening the temperature range in which the selective burying growth is possible to a range of 475° to 600° C. Therefore, a long wavelength LD capable of performing a high speed operation and in which the film of the undoped AlInAs layer 4 is selectively grown without strictly controlling the growth temperature is obtained.

In addition, in the undoped AlInAs layer 4, any dopant which is quite easily diffused, such as Fe in the Fe-InP layer, is not included. Accordingly, by employing Be which is more difficult to diffuse than Zn for the p type dopant in the p type InP layer, the impurity amounts which are diffused into the active layer 3 can be suppressed, thereby enabling fabricating a long wavelength LD having an impurity profile in accordance with the design.

In the above-described seventh and eighth embodiments, a long wavelength LD is described, but a simple modulator is obtained by reversing the operating voltage. Furthermore, a complicated device integrating an LD, a modulator, a waveguide, and a photodetector and including a burying layer may be made with the same effects as described above.

What is claimed is:

1. A method for growing a high resistance crystalline compound semiconductor layer in a semiconductor device, the device including a plurality of compound semiconductor layers having different compositions, including dopant impurities in a concentration that positions the Fermi level of the compound semiconductor layer at the center ±20 percent of the band gap energy of the compound semiconductor, by growing the compound semiconductor layer at a first temperature metal organic chemical vapor deposition employing an organic metal compound including In, an organic metal including Al, and one of a hydrogenated compound and an organic metal compound including As.

2. A method for growing a high resistance crystalline compound semiconductor layer in a semiconductor device, the device including a plurality of compound semiconductor layers having different compositions, including dopant impurities producing p type conductivity in a concentration that positions the Fermi level of the compound semiconductor layer at the center ±20 percent of the band gap energy of the compound semiconductor, by growing the compound semiconductor layer at a first temperature by metal organic chemical vapor deposition employing an organic metal compound including In, an organic metal compound including Al, and one of a hydrogenated compound and an organic metal compound including As.

3. A method for growing a high resistance crystalline compound semiconductor layer in a semiconductor device, the device including a plurality of compound semiconductor layers having different compositions, including dopant impurities forming a shallow acceptor level in a concentration that positions the Fermi level of the compound semiconductor layer at the center ±20 percent of the band gap energy of the compound semiconductor by growing the compound semiconductor layer at a first temperature by metal organic chemical vapor deposition employing an organic metal including In, an organic metal compound including Al, and one of a hydrogenated compound and an organic metal compound including As.

4. A method for growing a high resistance crystalline compound semiconductor layer in a semiconductor device, the device including a plurality of compound semiconductor layers having different compositions, including a Group IV element acceptor dopant impurity in a concentration that positions the Fermi level of the compound semiconductor layer at the center ±20 percent of the band gap energy of the compound semiconductor, by growing the compound semiconductor layer at a first temperature by metal organic chemical vapor deposition employing an organic metal compound including In, an organic metal including Al, and one of a hydrogenated compound and an organic metal compound including As.

5. The crystal growth method of claim 4, wherein the acceptor dopant impurity is carbon.

6. A method for growing a high resistance crystalline compound semiconductor layer in a semiconductor device, the device including a plurality of compound semiconductor layers having different compositions, including dopant impurities producing p type conductivity in such a concentration that positions the Fermi level of the compound semiconductor layer at the center ±20 percent of the band gap energy of the compound semiconductor, by metal organic chemical vapor deposition employing an organic metal compound including In, an organic metal compound including Al, and one of a hydrogenated compound and an organic metal compound including As.

7. A method for growing a high resistance crystalline compound semiconductor layer in a semiconductor device, the device including a plurality of compound semiconductor layers having different compositions, including forming shallow acceptor levels in a concentration that positions the Fermi level of the compound semiconductor layer at the center ±20 percent of the band gap energy of the compound semiconductor, by metal organic chemical vapor deposition employing an organic metal compound including In, an organic metal compound including Al, and one of a hydrogenated compound and an organic metal compound including As.

8. A method for growing a high resistance crystalline compound semiconductor layer in a semiconductor device, the device including a plurality of compound semiconductor layers having different compositions, including a Group IV element acceptor dopant impurity in a concentration that positions the Fermi level of the compound semiconductor layer at the center ±20 percent of the band gap energy of the compound semiconductor, by metal organic chemical vapor deposition employing an organic metal compound including In, an organic metal compound including Al, and one of a hydrogenated compound and an organic metal compound including As.

9. The method of claim 8 wherein the acceptor dopant impurity of said IV group element is made a carbon.

10. A method for growing a high resistance crystalline compound semiconductor layer in a semiconductor device, the device including a plurality of compound semiconductor layers having different compositions, including a Group II element acceptor dopant impurity in a concentration that positions the Fermi level of the compound semiconductor layer at the center ±20 percent of the band gap energy of the compound semiconductor, by metal organic chemical vapor deposition employing an organic metal compound including In, an organic metal compound including Al, and one of a hydrogenated compound and an organic metal compound including As.

11. The method of claim 10 wherein the acceptor impurity one of and beryllium magnesium.

12. The method of claim 8 including incorporating a dopant impurity forming a deep donor level in the compound semiconductor.

13. The method of claim 12 wherein the dopant impurity forming a deep donor level is oxygen.

14. The method of claim 13 wherein the concentration of oxygen is more than ten times the concentration of the acceptor impurity.

15. A method for growing a high resistance crystalline compound semiconductor layer in a semiconductor device, the device including a plurality of compound semiconductor layers having different compositions, including a dopant impurity forming one of a deep donor level and an acceptor level in a concentration that positions the Fermi level of the compound semiconductor layer at the center ±20 percent of the band gap energy of the compound semiconductor, by metal organic chemical vapor deposition employing an organic metal compound including In, an organic metal compound including Al, and one of a hydrogenated compound and an organic metal compound including As.

16. The method of claim 15 wherein the doping impurity forming one of deep donor and acceptor levels is oxygen.

17. The growth method of a high resistance compound semiconductor layer of claim 10 including incorporating a dopant impurity forming a deep donor level in the compound semiconductor.

18. The growth method of a high resistance compound semiconductor layer of claim 17 wherein the dopant impurity forming a deep donor level is oxygen.

19. The growth method of a high resistance compound semiconductor layer of claim 18 wherein the concentration of oxygen is more than ten times the concentration of the acceptor impurity.

* * * * *

UNITED STATES PATENT AND TRADEMARK OFFICE
CERTIFICATE OF CORRECTION

PATENT NO. : 5,679,603
DATED : October 21, 1997
INVENTOR(S) : Kimura et al.

It is certified that error appears in the above-identified patent and that said Letters Patent is hereby corrected as shown below:

Column 16, Line 44, after "metal" insert --compound--;

Line 66, after "semiconductor" insert--,--;

Column 17, Line 2, after "metal" insert --compound--;

Line 15, after "metal" insert --compound--;

Line 17, after "of" delete --and--;

Line 17, after "beryllium" insert --and--.

Signed and Sealed this

Ninth Day of June, 1998

Attest:

BRUCE LEHMAN

Attesting Officer

Commissioner of Patents and Trademarks